United States Patent [19]
Deak et al.

[11] Patent Number: 5,161,981
[45] Date of Patent: Nov. 10, 1992

[54] FOLDABLE STACKING CONNECTOR

[75] Inventors: Frederick R. Deak, Kernersville; Lesley W. H. McCormick, Lewisville, both of N.C.; George R. Schmedding, Hummelstown, Pa.; Keith L. Volz, Jamestown, N.C.; Douglas M. Walburn, Harrisburg, Pa.

[73] Assignee: AMP Incorporated, Harrisburg, Pa.

[21] Appl. No.: 848,891

[22] Filed: Mar. 10, 1992

[51] Int. Cl.5 .............................................. H01R 9/09
[52] U.S. Cl. ...................................... 439/66; 439/67; 439/77; 439/491; 439/591; 439/596
[58] Field of Search ................. 439/66, 67, 77, 91, 439/493, 591, 596

[56] References Cited

U.S. PATENT DOCUMENTS

| | | | |
|---|---|---|---|
| 3,851,297 | 11/1974 | Munro | 339/61 M |
| 3,985,413 | 10/1976 | Evans | 339/17 LM |
| 4,057,311 | 11/1977 | Evans | 339/17 M |
| 4,693,529 | 9/1987 | Stillie | 439/67 |
| 4,695,258 | 9/1987 | Hanson et al. | 439/67 |
| 4,850,883 | 7/1989 | Kabadi | 439/67 |
| 4,913,656 | 4/1990 | Gordon et al. | 439/67 |
| 4,975,068 | 12/1990 | Squires | 439/67 |
| 5,026,290 | 6/1991 | Dery | 439/67 |
| 5,057,023 | 10/1991 | Kabadi et al. | 439/67 |

Primary Examiner—Paula A. Bradley
Attorney, Agent, or Firm—William B. Noll

[57] ABSTRACT

A high density connector (10) includes a plastic housing (12) with covers (30, 38) hinged to a frame (14) and foldable thereagainst to compress a plurality of circuits (60, 67) fitted between the covers to engage and compress elastomeric members (46, 54) and be interconnected thereby through fasteners (76-82), clamping the assembly of circuits and housing together. Embodiments include having frame and cover hinged at the sides by hinges (36, 44) or at the ends by hinges (108, 116) and including integrally molded cover frame and hinges versions include interconnecting two or more boards from the same or opposite directions relative to the connector housing.

12 Claims, 9 Drawing Sheets

FOLDABLE STACKING CONNECTOR

This invention relates to an electrical connector for interconnecting circuits having closely spaced circuit pads or traces.

BACKGROUND OF THE INVENTION

The continuing reduction in the size of electrical and electronic components, and the concomitant reduction in the spacing of circuit traces and pads, along with substantial increases in the numbers of such circuits challenges the traditional approach of manufacturing connectors through stamping and forming of individual contacts which are assembled into plastic housings to electrically and mechanically interconnect circuits and components. To this end, a number of approaches have been developed that utilize etched circuits formed on thin films and wrapped around elastomeric cores to define an interconnection medium on extremely close centers. One such development for a substrate connector is represented in U.S. Pat. No. 3,851,297, issued Nov. 26, 1974. Another example is found in U.S. Pat. No. 3,985,413 issued Oct. 12, 1976, and still another example for interconnecting boards is found in U.S. Pat. No. 4,057,311 issued Nov. 8, 1977. Along with the need to find ways of providing extremely closely spaced interconnections is a need for simplifying the handling and assembly of such connectors to assure that the extremely small conductive elements are properly positioned and aligned to effectively interconnect the pads and traces of circuits to be interconnected. Additionally, it is desirable that connectors for such uses be easy to handle, assemble, and position to assure a proper alignment and interconnection.

Accordingly, it is an object of the present invention to provide an electrical connector for use with closely spaced circuits, such as those on printed circuit boards or components, that facilitates a ready alignment and assembly to assure an effective interconnection. It is yet a further object to provide a simple and reliable connector for high density circuit interconnections that is simple to manufacture and use and results in cost reductions in interconnecting closely spaced circuits and components. It is still a further object to provide a connector assembly that is large one piece, including a frame, elastomeric conductive member and covers, hingedly connected to the frame to be folded to provide a stacking of elements in interconnecting circuits and components.

SUMMARY OF THE INVENTION

The present invention achieves the foregoing objectives through the provision of a plastic housing which includes a central core or frame having one or more slots extending along the length thereof, made to contain elastomeric members comprised of a resilient core carrying conductive elements and dimensioned to be of a diameter greater than the thickness of the frame so as to protrude slightly therefrom and engage circuits pressed against the frame. The frame further includes, hingedly mounted thereto, a pair of covers which fold down against the circuits to be interconnected, driving such circuits together against the elastomeric member, to effect an interconnection therewith and form a stack of elements defining the connector. This stack is one piece in that the frame and covers are hingedly joined to facilitate ease of inventory and handling and simplicity in manufacture of the connector housing forming the frame and covers. The housing includes projections extending perpendicular to the surface thereof that engage reliefs or apertures in the circuits to be interconnected to assure a proper alignment of the circuit pads or traces relative to the elastomeric element carried by the housing. The housing further includes apertures receiving fasteners that extend also through the circuits to be interconnected, further assuring alignment and additionally, a proper mechanical holding together of the circuits and housing under compression against the elastomeric member and against axial displacement. The housing is foldable to provide a stack in compression with the fasteners driving the covers to in turn drive the circuits against the elastomeric member to provide a stable, low resistance, electrical interface. The invention contemplates the use of hinges joining the frame and covers along the sides of the frame and covers or, alternatively, along the ends of the frame and covers. The invention also contemplates an integrally molded hinge formed as the frame and covers are formed, a so-called "polyhinge," the use of which makes the frame and covers one piece. The frame, covers, and hinges are arranged to provide a Z-shaped configuration which, in the side-hinged version, allows circuits to be interconnected that extend from opposite directions, and in the end version, allows circuits to be connected either from an opposite direction or in parallel. A further embodiment of the invention includes a frame having a step in the thickness thereof with a pair of slots containing elastomeric members of different diameters arranged to accommodate and interconnect an offset of the circuits as well as to interconnect circuits approaching from opposite directions relative to the connector, all to the advantage of packaging flexibility.

The elastomeric member utilized by the invention is of the type disclosed in the aforementioned patents, namely, including a resilient core of insulating material having a thin film containing copper traces etched thereon, suitably plated, defined as an array of closely spaced, but electrically independent, conductive elements. The stacking and compression of frame, cover, circuits through the use of fasteners assures a compression of the resilient core to drive the conductive elements against circuit pads or traces and provide an interconnection which is not only reliable, but has advantages in terms of defining an extremely short electrical path and improved electrical characteristics in terms of resistance, inductance, and capacitance.

IN THE DRAWINGS

DETAILED DESCRIPTION OF THE INVENTION

Figure 8:
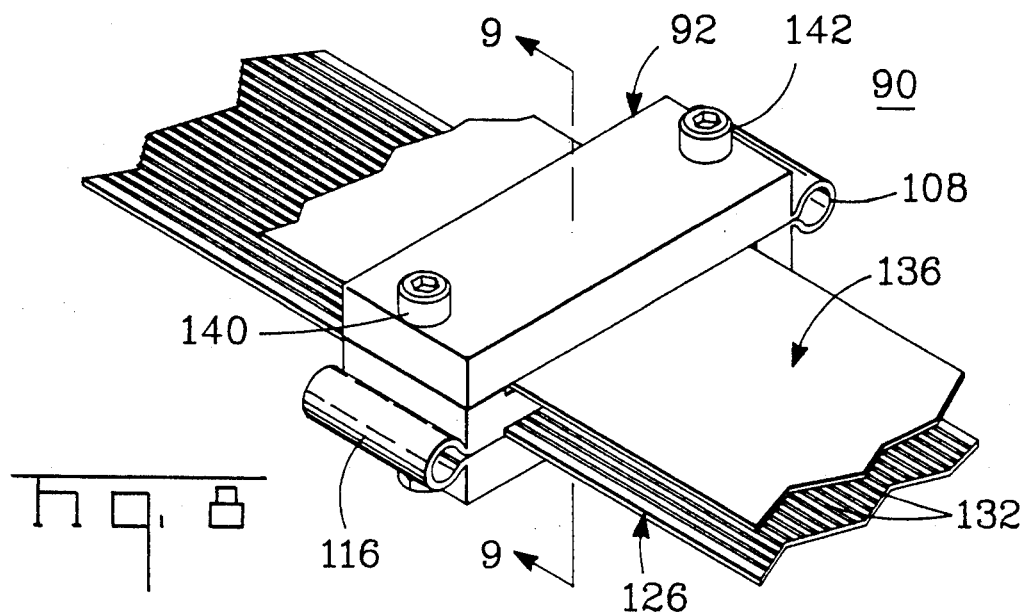
FIG. 8 is a perspective showing the connector and circuits of FIGS. 6 and 7 in a fully assembled and compressed condition with fasteners applied.
Figure 10:
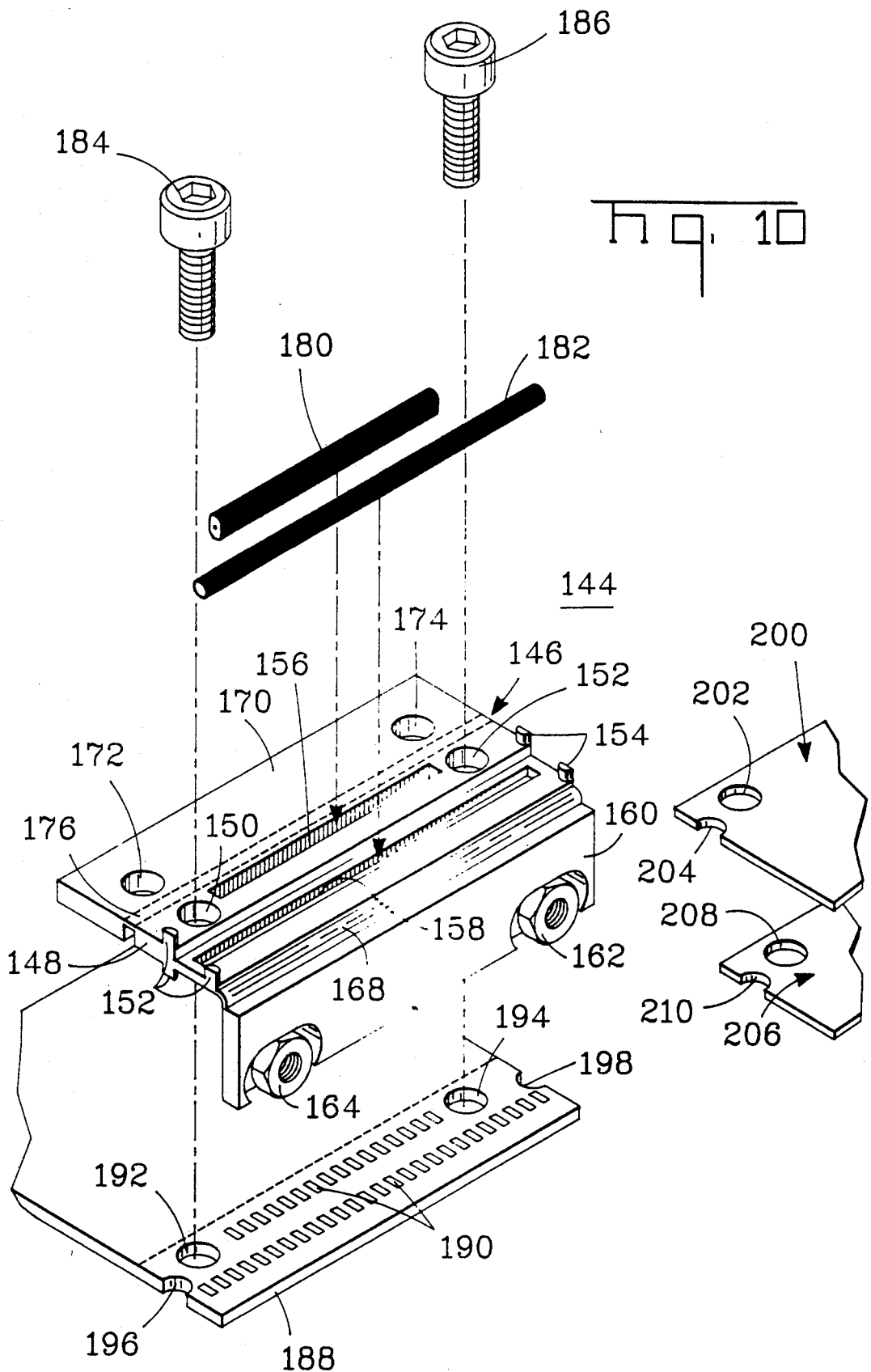
FIG. 10 is a perspective showing a further alternative embodiment of the invention with a connector housing, elastomeric members, circuits, and fasteners in an exploded relationship prior to assembly.

The invention contemplates a connector for interconnecting conductive trances or pads on printed circuit boards, flexible circuits, functionally equivalent to printed circuit boards, and flexible cable, all on very close centers. For example, centers between conductive paths may range on the order of between 0.005 and 0.050 inches, or slightly smaller, with spacings between 0.002 and 0.025 inches. FIG. 4 shows a connector 10 interconnecting a pair of printed circuit boards 60 and 67 which would have the traces or pads on the end surfaces thereof, an array of pads 74 shown on board 67 in FIG. 3. FIG. 8 shows a connector 90 interconnecting flat flexible cable 126 and 136 having films 130 and 138, the conductive traces thereon shown as 132 and 140, respectively, in FIG. 6. FIG. 10 shows a connector 144 adapted to interconnect three printed circuit boards 188,200, and 206 in the manner indicated in FIGS. 11 and 12; the conductive traces 190 being shown on board 188 in FIG. 10.

It is to be understood that the connector of the invention is intended to interconnect printed circuit boards or printed circuit boards to cable or cables to cable where the conductive traces are on extremely small centers.

Figure 1:
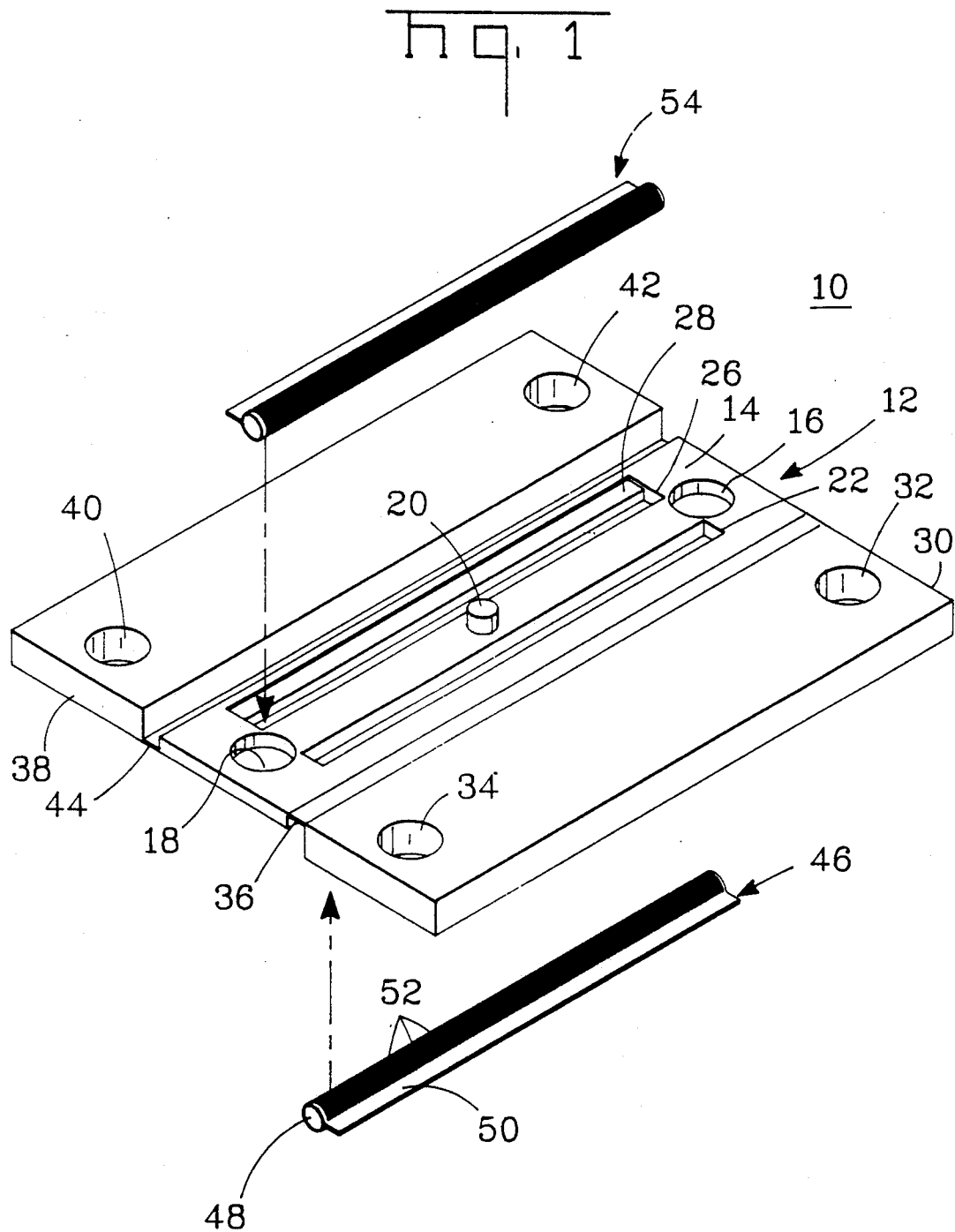
FIG. 1 is a perspective showing the connector of the invention with elastomeric members exploded from a housing in an open configuration.

Referring now to FIG. 1, the connector 10 may be seen to include a housing 12 suitably formed as by molding of engineering plastic having adequate dielectric and insulating characteristics. The housing 12 includes a center portion, frame 14 having at the ends thereof apertures 16 and 18 including a central projection 20, and an opposite projection 36 shown in FIG. 5. Additionally, frame 14 includes longitudinal slots 22 and 26 which extend along the length of the frame between the ends and between the holes 16 and 18. Slot 22 includes an adjacent shelf shown as 24 in FIG. 5 and slot 26 includes a shelf shown as 28 in FIG. 1. The frame 14 has attached to the sides thereof a pair of covers 30 and 38. The cover 30 includes holes 32 and 34 proximate the opposite ends thereof, and a hinge 36 that joins cover 30 to frame 14. Cover 38 includes holes 40 and 42 proximate the opposite ends thereof, and a hinge 44 joining cover 38 to frame 14. As can be seen from the preferred embodiment of a housing 12 shown in FIGS. 1-5, the hinges 36 and 44 extend along the side edges of the frame and covers in an opposite sense to allow a folding and stacking of the covers relative to the frame in the manner shown in FIG. 5. These hinges are preferably "polyhinges," a hinge concept well known in the art to have characteristics facilitating repeated movement and flexing of the hinge. FIG. 1 additionally shows a pair of elastomeric connectors 46 and 54, each identical in the embodiment in FIG. 1 to include nonconducting and resilient core 48 around which is wrapped and bonded a thin film 50 carrying on the surface thereof a series of conductive traces that extend substantially around the periphery of the elastomeric members 46 and 54. These conductive traces are typically formed as by etching away copper foil bonded to the film 50 which is typically a Kapton-type polyamide film, although polyester films and other films have been employed. The etched copper foil is typically made to include a plating of nickel with a plating of gold thereover with a sufficient thickness to provide a stable, low resistance interface when the elastomeric member is compressed. The members 46 and 54 are placed within the slots 22 and 26, respectively, in the manner shown in FIG. 2 with the tab portions, such as 50, caused to rest within the shelves 24 and 28 in the manner shown in FIG. 5. The elastomeric members 46 and 54 may be bonded to frame 14 through the use of adhesive applied to the tabs extending from the members 46 and 54 on the side facing the shelves 24 and 28.

Figure 2:
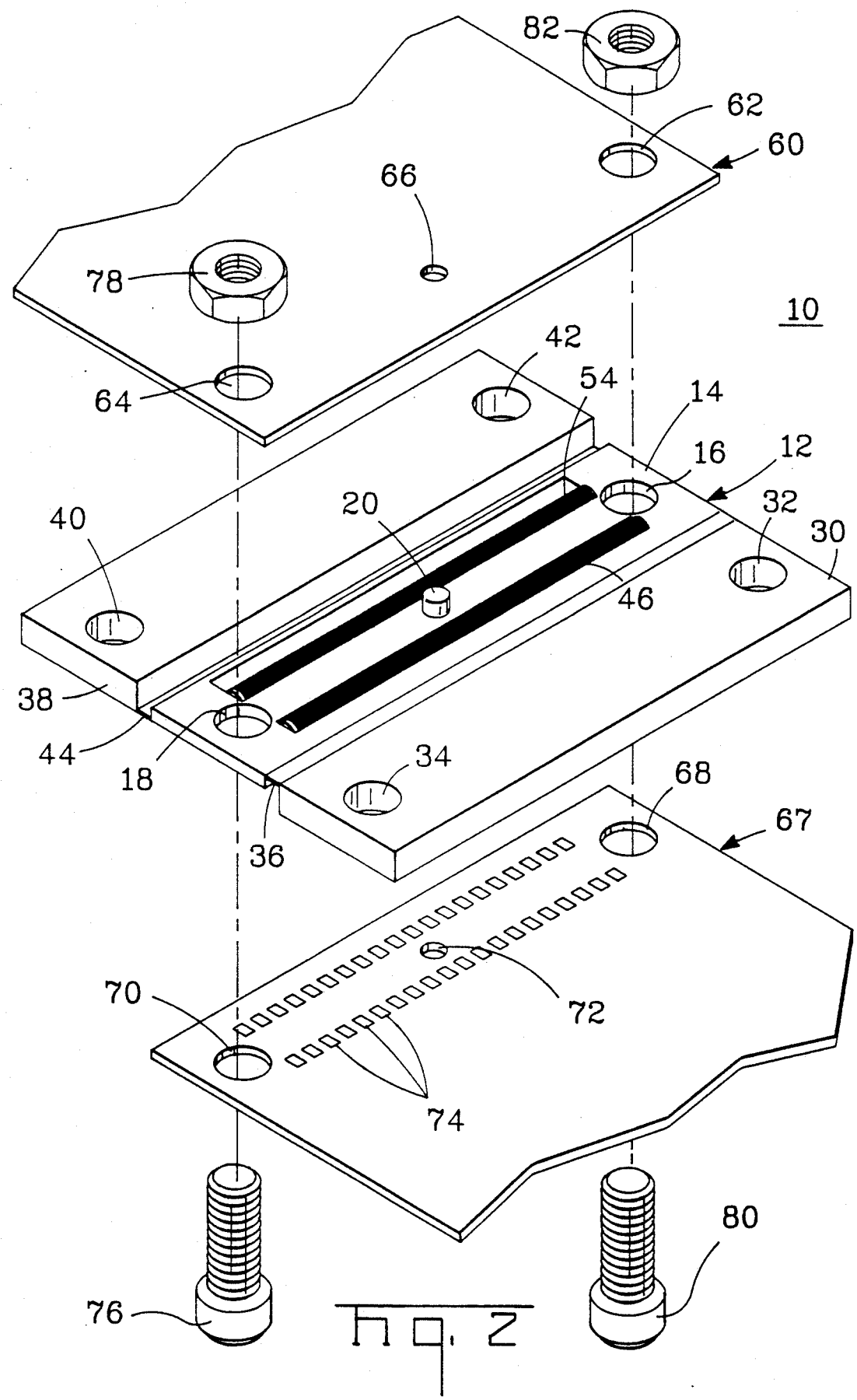
FIG. 2 is a perspective showing the connector of FIG. 1 with elastomeric members inserted therein, in the open position, with circuits to be interconnected positioned above and below the connector and with fasteners shown exploded from the assembly.

In FIG. 2, the elastomeric members 46 and 54 are shown in place in frame 14 with the frame and covers shown in the unstracked or open position. Positioned above the connector 10 shown in FIG. 2 is a printed circuit board 60 having holes 62 and 64 in the outside edges and a centrally disposed hole 66. Positioned beneath connector 10 is a further printed circuit board 67 having holes 68 and 70 in the outside edges and a centrally displaced disposed hole 72. Additionally, printed circuit board 67 includes two rows of conductive traces 74 placed on centers suitable for accommodating the particular density of traces of board 67. It is to be understood that the traces 74 extend on one or both surfaces of board 67 or within laminations within such board in a manner well understood. It is also to be understood that board 60 has similar traces and that both of the boards may well carry electronic components which, when interconnected, perform a variety of desirable circuit functions. Additionally shown in FIG. 2 are fasteners 76, 78, 80, and 82.

Figure 3:
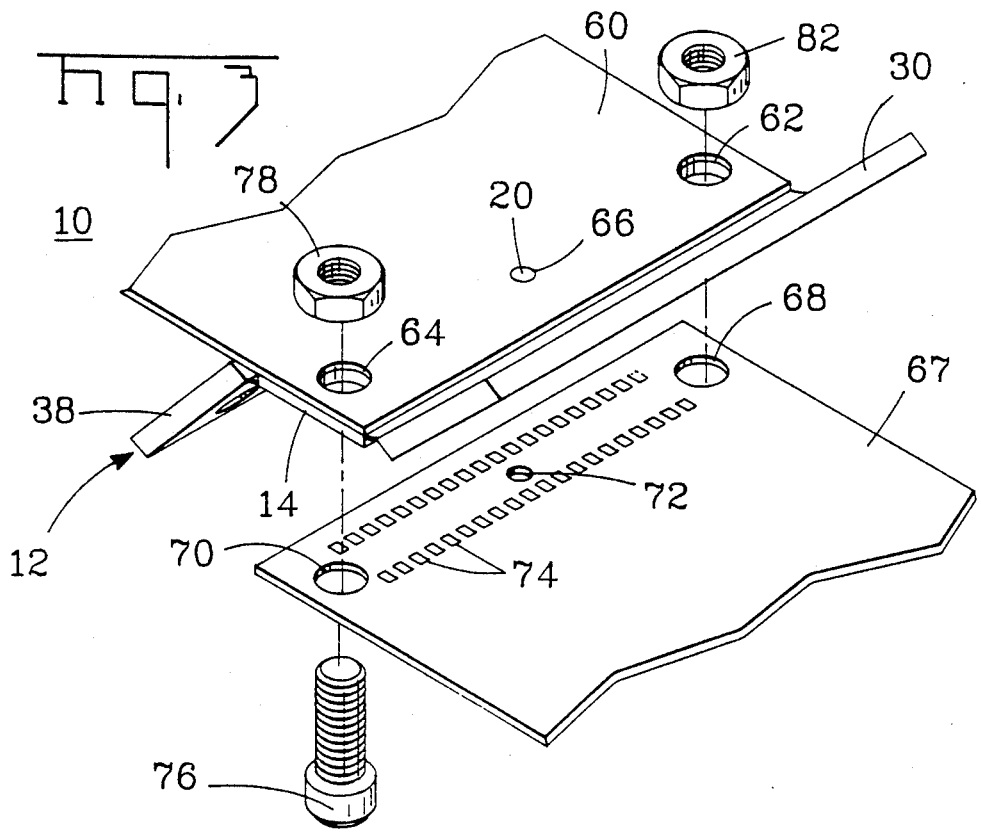
FIG. 3 is a perspective showing the connector of the invention being applied to one of the circuits with the other circuit and fasteners shown exploded therefrom.
Figure 4:
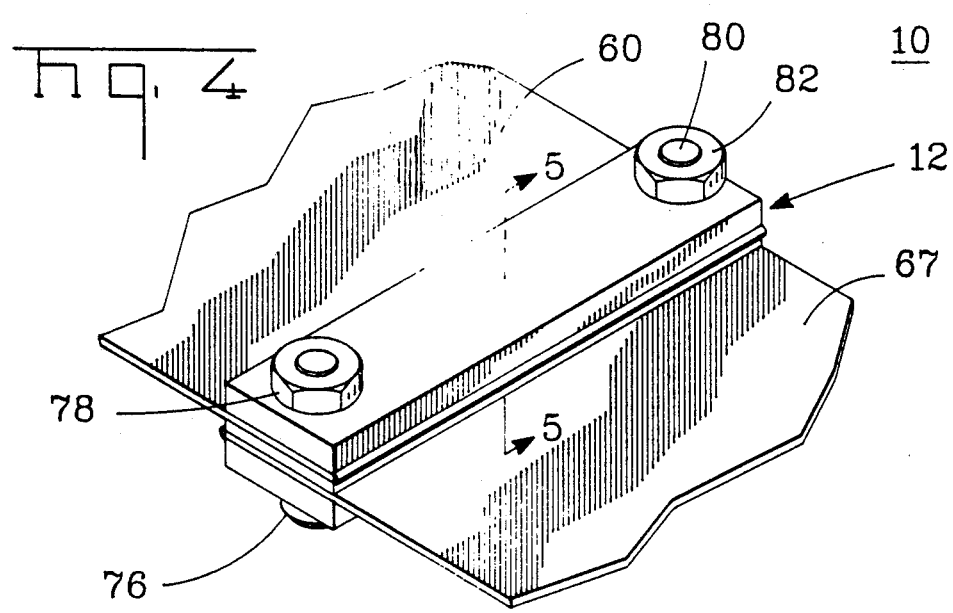
FIG. 4 is a perspective of the invention connector fully assembled and fastened to interconnect a pair of circuits.
Figure 5:
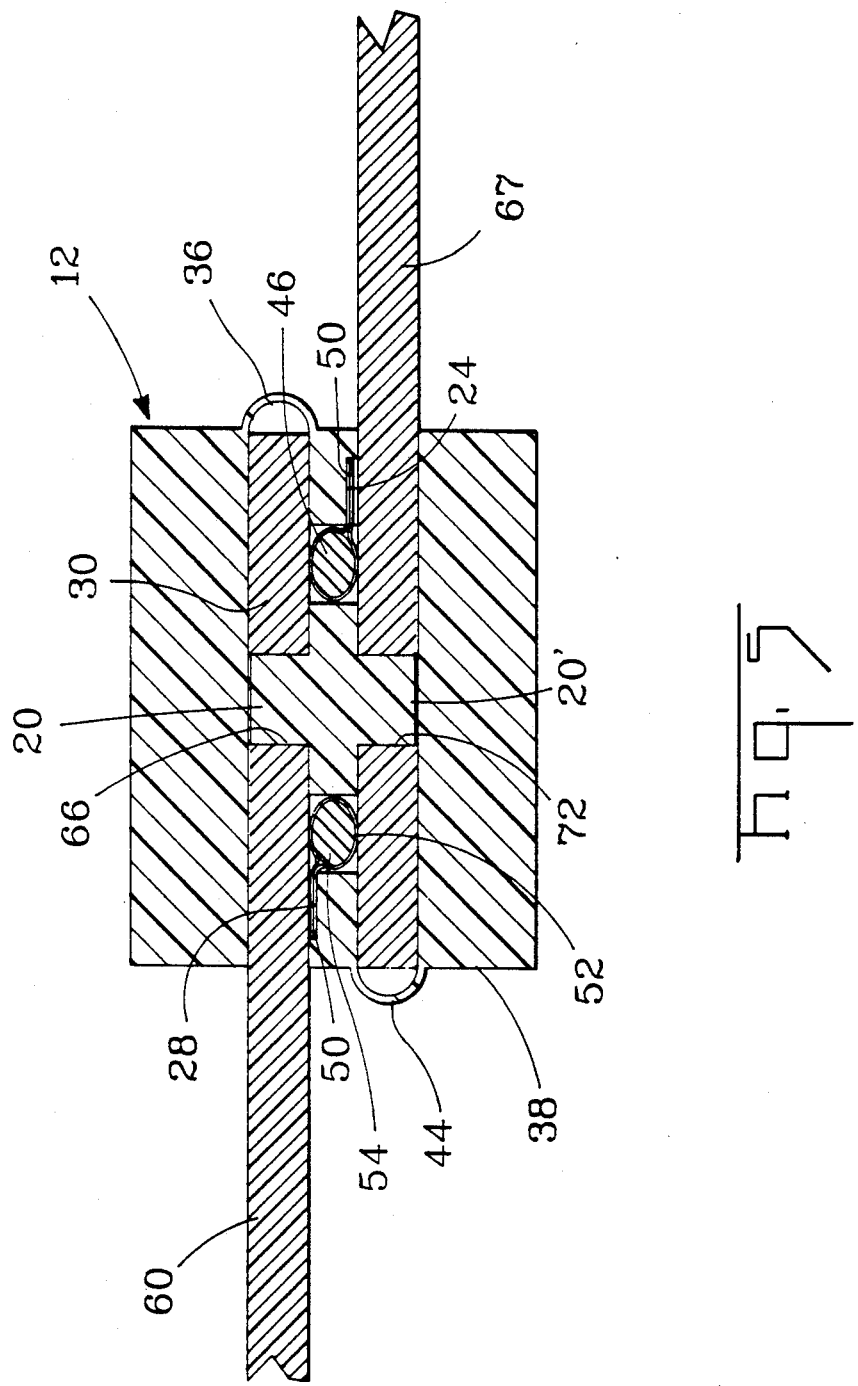
FIG. 5 is a sectional view taken through lines 5—5 of FIG. 4.

In assembly, the first step of which is shown in FIG. 3, the connector 10, frame 14, is positioned against the underside of board 60 with the cover 30 tilted up and the cover 38 tilted downwardly to accommodate the stacking of the boards against the connector. In FIG. 4, this stacking is shown completed with the fasteners 76 and 80 suitably inserted through the various holes in board, connector, and covers and drawn together by fastener nuts 78 and 82 to clamp the stack of boards and connector together. This results in the elastomeric members 46 and 54 being compressed so that the conductive elements 52 are driven into engagement with the conductive traces of the boards to interconnect the traces of board 60 to the traces of board 67 and thus provide an electrical interconnection therebetween. To be appreciated is the fact that that connection is extremely short, physically, and therefore, enhanced in terms of impedance characteristics, including resistance, inductance, and capacitance. In the assembly of the connector 10 to board 60, the center projection 20, through fitting into the hole 66 provides an initial positioning of the connector relative to the board 60. Installation of the board 67 onto the frame portion of the connector allows the projection 20' as shown in FIG. 5 to be inserted in holes 72 thus providing an initial alignment of the board 67 to connector 10. Thereafter, addition of the fasteners extended through the holes in the boards and in the cover and frame members further assures appropriate alignment of the pads relative to the conductive elements on elastomeric members 46 and 54. The center-to-center spacing of conductive elements 52 is typically made to be a fraction of the center-to-center spacing of conductive pads or traces 74 so that a number of interconnections per pad are made to provide redundancy and improve reliability of contact. Reference may be had to the aforementioned patents for teachings as to the construction of acceptable elastomeric members.

The assembly in FIGS. 4 and 5 shows the boards 60 and 67 to be physically clamped together and held against axial displacement in precise alignment with respect to conductive pads and the elastomeric members. As indicated in FIG. 5, the stack of the connector is essentially Z-shaped, in cross-section, the covers forming the top and bottom of a Z, and the frame forming the middle as interconnected by the hinge elements. As can be appreciated, the connector of the invention is simple, easy to use, and achieves a precise mechanical and electrical interconnection of conductive traces on printed circuit boards or the like.

Figure 6:
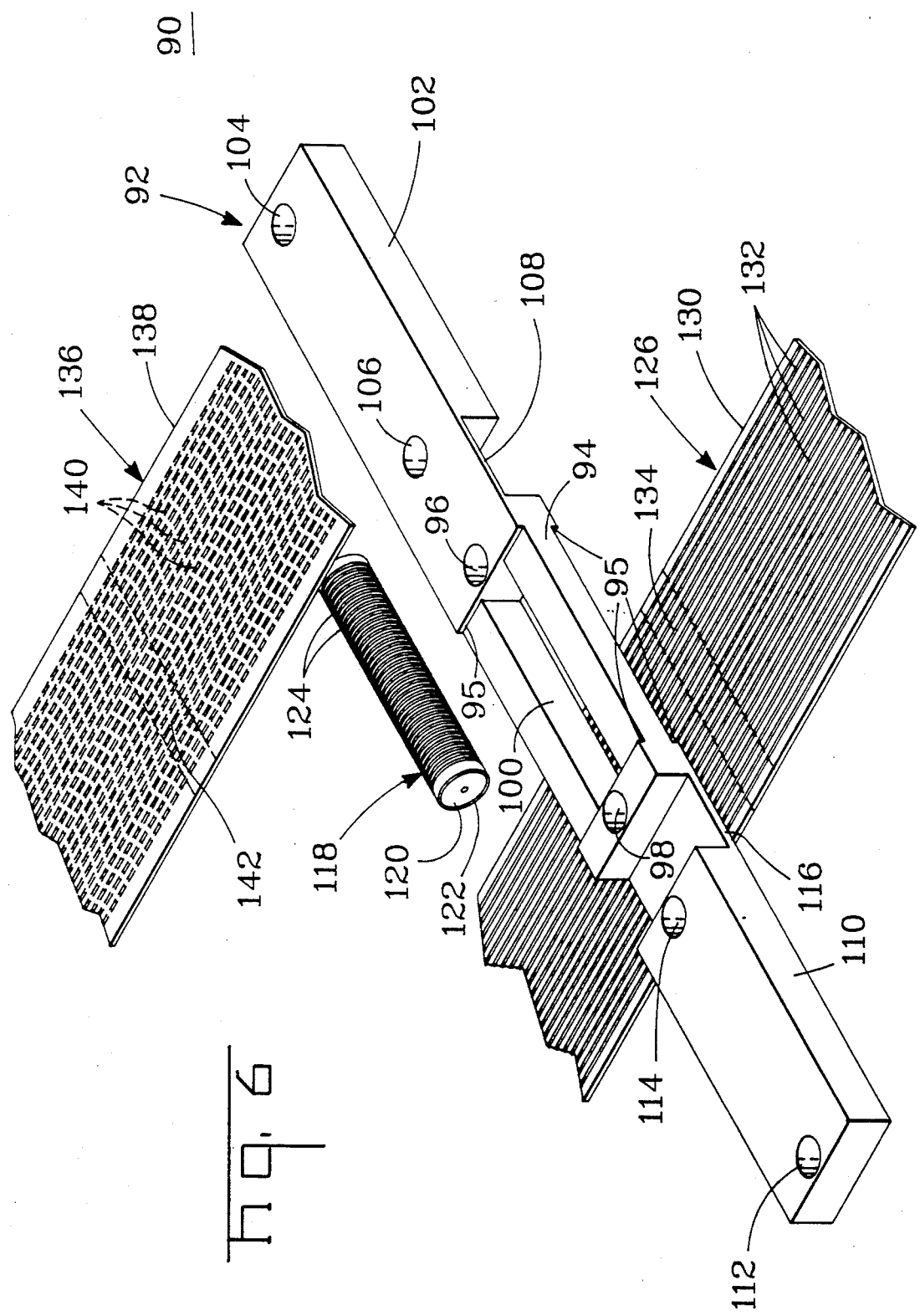
FIG. 6 is a perspective of an alternative embodiment of the connector of the invention showing the connector housing with an elastomeric member removed therefrom and with circuits positioned above and below the connector.
Figure 7:
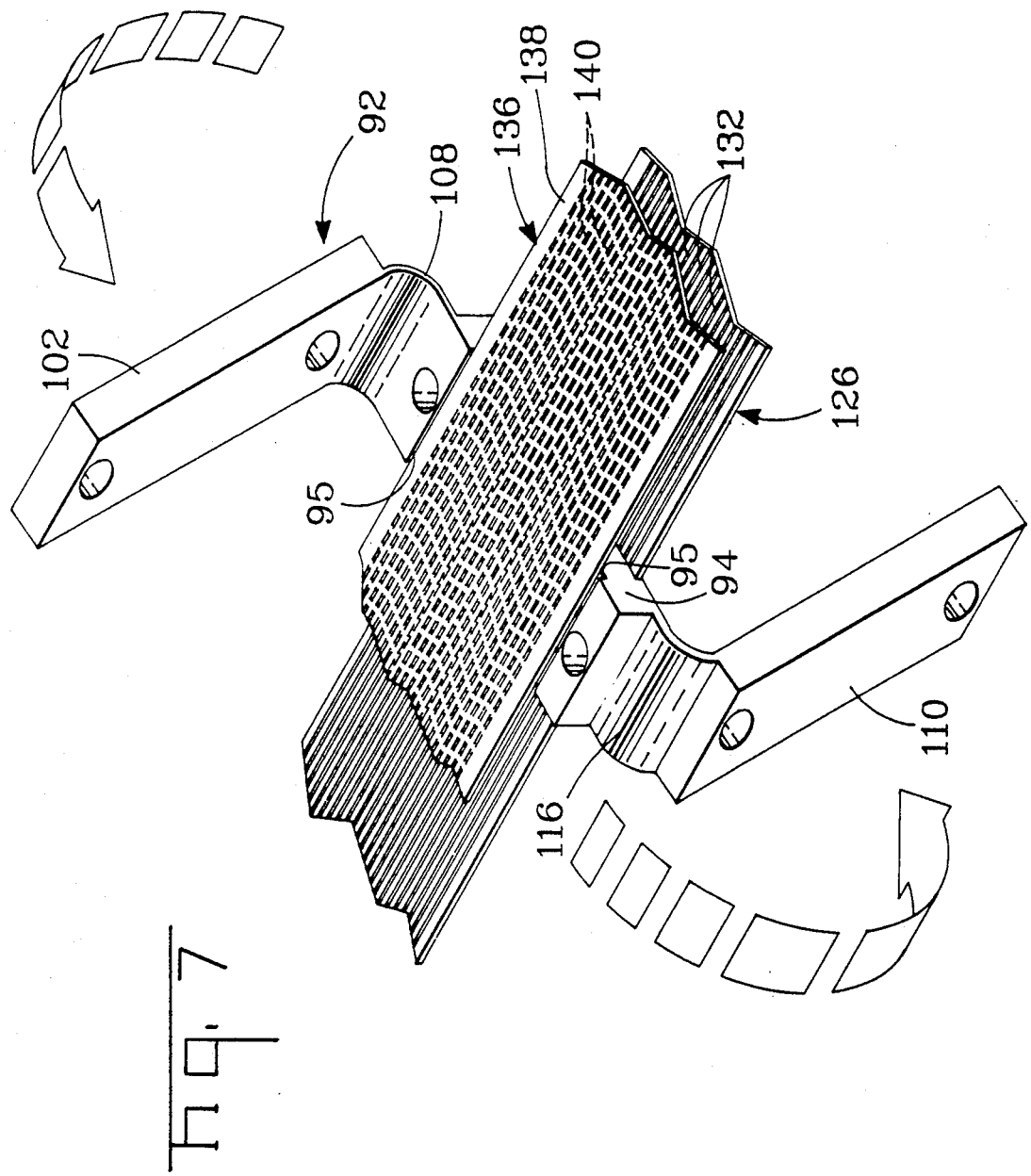
FIG. 7 is a perspective showing the connector and circuits of FIG. 6, partially assembled and positioned in alignment for further assembly.
Figure 9:
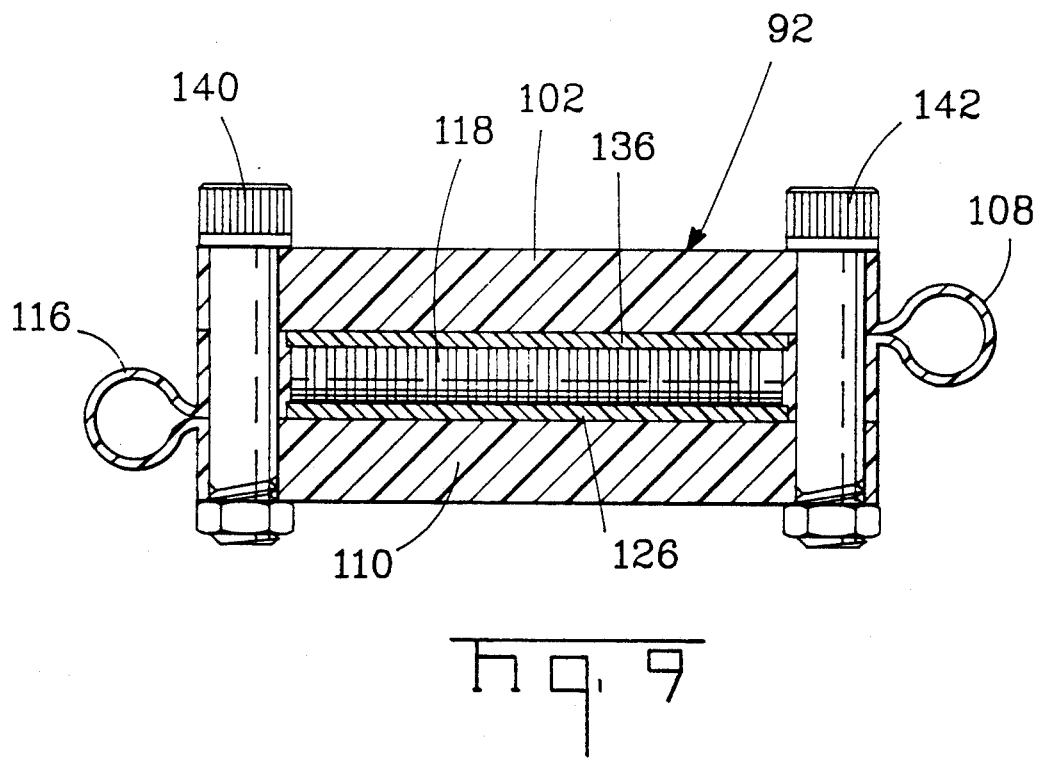
FIG. 9 is a section taken through lines 9—9 of FIG. 8.

Turning now to FIG. 6, an alternative embodiment of the invention connector is shown as 90 to include a housing 92 formed of suitable engineering plastic material, preferably having characteristics to facilitate the use of "polyhinges." The housing 92 includes a frame 94 having apertures 96 and 98 and a slot 100 extending along the length of frame 94. The housing 92 further includes a cover 102 having apertures 104 and 106 proximate the ends thereof, and a further cover 110 having apertures 112 and 114 proximate the ends thereof. Cover 102 is joined to frame 94 by hinge 108 and cover 110 is joined to frame 94 by a hinge 116 as shown in FIG. 6, and particularly is shown in FIGS. 7, 8, and 9. Referring now to FIG. 6, connector 90 includes an elastomeric member 118 having a resilient insulating core 120 surrounded by a thin film 122 having conductive traces 124 bonded thereto and extending around the periphery, the traces 124 being separated and electrically separate, each from the other. The elastomeric member 118 fits within the slot 100 and is of a diameter relative to the thickness of frame 94 to extend slightly above and slightly below the surfaces of the frame. Additionally shown in FIG. 6 is flexible circuit 126 formed of an insulating sheet 130 carrying conductive traces 132 thereon. The sheet 130 may carry a further insulating layer not shown, which would be stripped away so that the segments of the conductive traces 132 positioned at 134 would be exposed for interconnection to the traces 124 of the elastomeric member 118. Positioned above connector 90 in FIG. 6 is a further cable 136 having a base film 138 with conductive traces 140 bonded thereto and suitably exposed as at 142 for interconnection to the elastomeric member 118. FIG. 7 shows the connector 10 with the frame 92 in the process of being applied to the cables which are positioned over the frame 94 with the outside edges resting against the edges 95 of the frame and the covers 102 and 110 folded down against the top of the cables. Thereafter, in the manner shown in FIGS. 8 and 9, fasteners 140 and 142 are applied through the various holes in the covers and frame of the housing 92 and operated to clamp the covers down against the cable and the frame to compress the elastomeric member 118 and effect an electrical and mechanical connection of the cables and the traces thereon within the connector.

Figure 11:
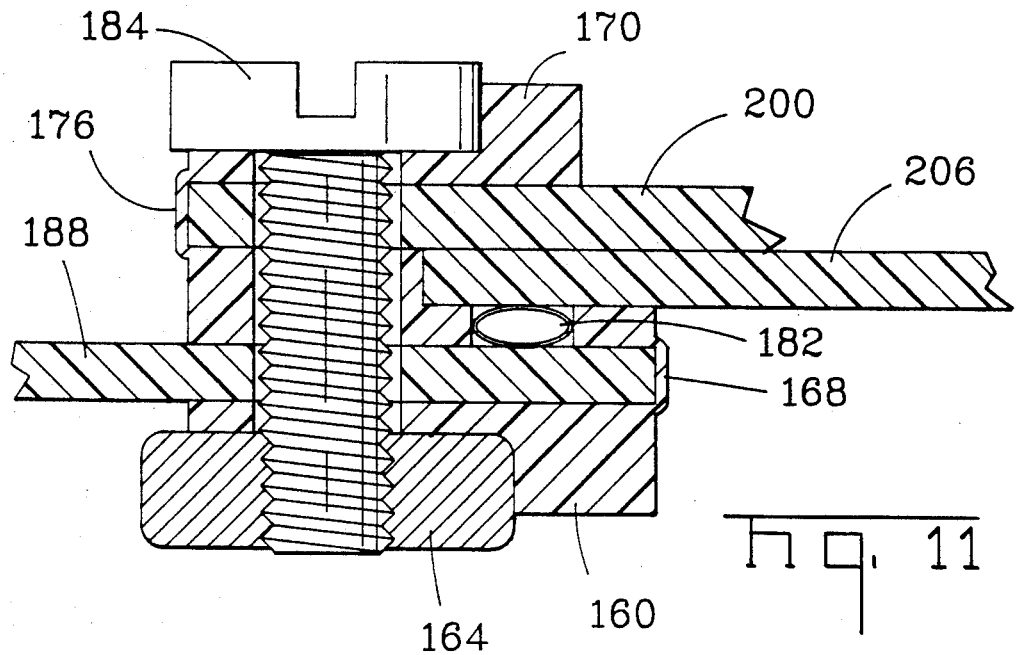
FIG. 11 is a side, elevational, and sectional view of the components shown in FIG. 10, following assembly and clamping to effect an electrical interconnection of the circuits.
Figure 12:
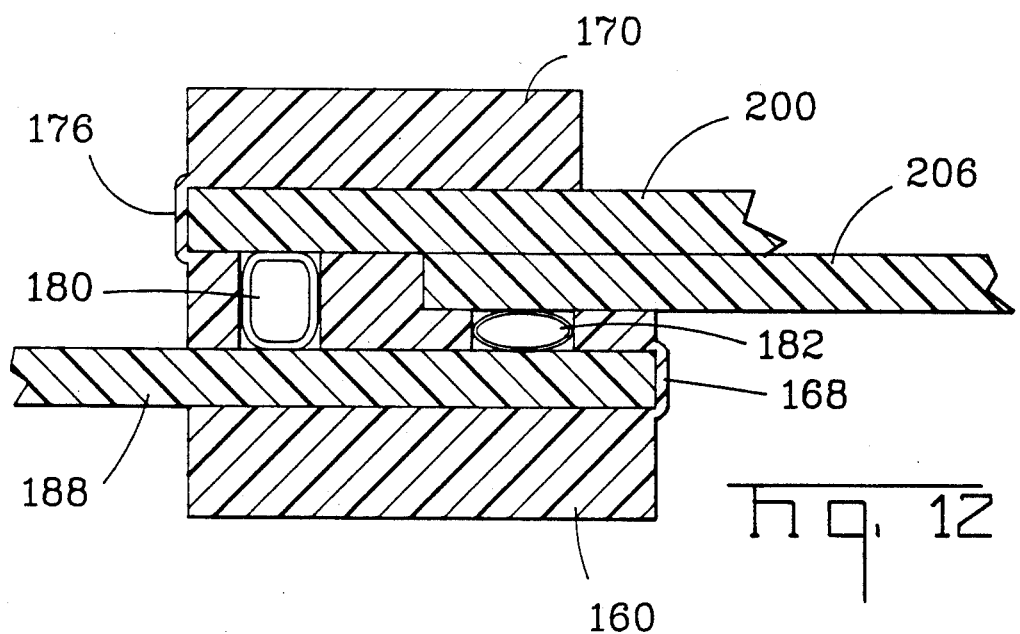
FIG. 12 is a side, elevational, and sectional view taken of the assembled components at a different section to reveal the interconnection of the boards with elastomeric members.

Turning now to FIGS. 10, 11, and 12, a further embodiment of the invention connector is shown to accommodate a number of printed circuit boards. The connector 144 includes a plastic housing 146 having a central frame 148 having holes 150 and 152 at opposite ends thereof. The frame 148 further includes a series of projections 152 extending upwardly and downwardly from the left-handed end of the frame and similar projections 154 extending upwardly and downwardly from the opposite end of the frame. A pair of slots extend along the length of the frame; the slot 156 being shorter and wider and deeper than a further slot 158 parallel to slot 156. As can be discerned from FIGS. 10 and 12, the frame 148 has a cross-section which includes two thicknesses, the larger thickness accommodating slot 156, and the smaller thickness accommodating slot 158. Housing 146 further includes a cover 160 having fasteners 162 and 164 at opposite ends thereof, and a hinge extending therealong joining the frame shown as 168. A further cover 170 is provided at the opposite edge of the frame, including holes 172 and 174 and a hinge 176 extending along the side edge of the cover joining it to frame 148. FIG. 10 shows positioned above the housing 146 a pair of elastomeric members 180 and 182 of different geometries, length, and diameter to fit within the slots 156 and 158. FIG. 12 shows these members in cross-section. Also shown in FIG. 1 are fasteners 184 and 186 positioned above and prior to assembly of the connector and printed circuit boards. A lower board 188 is shown positioned beneath the connector 144 including two rows of contact pads or traces shown as 190 and at opposite ends are holes 192 and 194. Reliefs 196 and 198 are provided at the edges of the printed circuit board. The edges of further boards are shown in FIG. 1 to include a board 200 that is essentially similar to board 188, a hole 202 in one corner being shown, and a relief 204 proximate such corner being shown. Board 206 similarly shows a hole 208 and a relief 210.

In assembly, the connector housing 146 is positioned on board 188 with the projections 152 and 154 made to engage the reliefs 196 and 198 to provide an initial alignment. Thereafter, cover 160 is folded around the end of board 188 and clamped temporarily. Next, the board 206 is applied with the relief 210 fitted on the projection 152 associated with the longer slot 158 and thereafter board 200 is applied with the relief 204 fitted in the projection 152 on the portion associated with slot 156, it being understood that similar reliefs in these two boards would be applied to the projections at the opposite ends of the frame. Next, the cover 170 is folded over the top of board 200 and the fasteners shown as 184 and 186 are applied passing through the various holes in the covers of the frame and the boards to be engaged in the fasteners shown associated with the cover 160, fasteners shown a 162 and 164. Thereafter, the fasteners may be operated to clamp the three boards together, compressing the elastomeric members 180 and 182 and effecting an electrical and mechanical interconnection of the various boards. FIGS. 11 and 12 show the relationship of the boards with the board 200 being interconnected to board 188 and with the board 206 similarly being connected to board 188, the boards being connected to the different rows of conductive traces 190.

As can be discerned, this stacking and folding assures alignment, clamping, and an easy assembly of very small and fine conductive traces. The embodiment illustrated in FIGS. 10-12 shows a stacking connector of a Z cross-sectional configuration accommodating more than two boards.

In a practical embodiment of the connector housing shown utilizing "polyhinge" techniques, a Celanex material 26, a polypropylene was employed through molding of the housing.

The invention has now been described relative to a specification and drawings in preferred embodiments, it being understood that variations on the details, such as the type of hinges and arrangement and frame of cover, are intended to provide a range of applications and variations as defined by the appended claims.

We claim:

1. An electrical connector of a type utilized to interconnect first and second circuits having arrays of conductive pads or traces thereon, including a plastic housing having a planar frame of a given length and thickness defined by sides and ends and extending therealong a pair of covers hingedly joined to the frame and foldable thereover to position overlying opposite side surfaces of the frame, the frame including at least one slot extending along the length of the frame and an elastomeric member fitted in said slot of a diameter exceeding the frame thickness, the said member including a series of discrete conductive elements extending from one side of the frame to the other positioned for radial deformation and driven by a resilient core extending beneath the conductive elements along the length of the slot, fastener means at each end of the connector extending through the frame and covers and operable to compress the covers against the first and second circuits, each fitted between a cover and the frame and compress the core and drive the conductive elements of the said member to interconnect the circuits electrically together and hold the assembly, frame, cover and circuits mechanically.

2. The connector of claim 1 including two slots extending along the length of said frame with an elastomeric member in each slot to interconnect two rows of conductive pads or traces on the first and second boards.

3. The connector of claim 1 wherein the said frame includes first and second thicknesses defining first and second levels of the said frame with a slot in each level extending along the length of the frame and an elastomeric member fitted within each slot, each elastomeric member being of a diameter appropriate for the thickness of the slot into which the member is fitted to provide a resilient core deformation and interconnection of the arrays of conductive pads or traces on said first and second circuits.

4. The connector of claim 3 including a third circuit having arrays of conductive pads or traces thereon the said frame and covers compressing the third circuit against at least one of the elastomeric members to interconnect such circuit to one of the other circuits.

5. The connector of claim 1 wherein the said covers join the said frame through a hinge positioned between each cover and the frame in a manner to facilitate a folding and stacking of the covers and frame to present a Z-shaped cross-sectional configuration in use.

6. The connector of claim 1 wherein the said covers are joined to the said frame through a hinge attaching the ends of the frame to the ends of the covers.

7. The connector of claim 1 wherein the said covers are joined to the said frame by a hinge extending along the sides of the frame.

8. The connector of claim 1 wherein the said covers and frame are joined by a hinge molded integrally with the frame and covers.

9. The connector of claim 1 including means for aligning the said circuits with respect to the said frame.

10. The connector of claim 9 wherein the said means includes surfaces projecting from the said frame to engage edge surfaces of the said circuits to provide such alignment.

11. An electrical connector of a type utilized to interconnect circuits having arrays of conductive pads or traces thereon including a plastic housing having a planar frame of a given length and thickness defined by sides and ends and extending therefrom a pair of covers hingedly joined to the frame and foldable thereover to be positioned overlying opposite side surfaces of the frame, the frame including at least one slot extending along the length of the frame and a conductive member fitted within said slot to extend above and below the surfaces of the said frame, the conductive member including discrete conductive contacts disposed above and below the surfaces of the said frame and means to resiliently drive the contacts to facilitate an engagement and contact with the conductive pads or traces of the said circuits upon the covers being folded down against the circuits, fastener means operable to compress the said covers against the said circuits and said means against the said frame and effect an electrical interconnection between said circuits and a mechanical connection of said circuits.

12. The connector of claim 11 wherein the covers and frame are hingedly connected through polyhinges.

* * * * *